(12) United States Patent
Razzell

(10) Patent No.: US 8,442,171 B2
(45) Date of Patent: May 14, 2013

(54) DIGITAL CORRECTION OF ANALOG POLYPHASE FILTERS

(75) Inventor: Charles John Razzell, Pleasanton, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/246,149

(22) Filed: Sep. 27, 2011

(65) Prior Publication Data

US 2012/0087451 A1    Apr. 12, 2012

Related U.S. Application Data

(60) Provisional application No. 61/391,034, filed on Oct. 7, 2010.

(51) Int. Cl.
*H04B 1/10* (2006.01)

(52) U.S. Cl.
USPC ........... 375/350; 375/261; 375/349; 375/325; 341/128; 341/139; 341/108; 455/324; 455/326

(58) Field of Classification Search .............. 341/128, 341/139, 108; 455/324, 326; 375/261, 349, 375/350, 325
See application file for complete search history.

(56) References Cited

U.S. PATENT DOCUMENTS

| 4,809,203 | A  | * | 2/1989 | Wilson et al. ................ 708/3 |
| 7,252,291 | B2 |   | 8/2007 | Khonsari |
| 2007/0058755 | A1 | * | 3/2007 | Husted .................... 375/332 |
| 2011/0019773 | A1 |   | 1/2011 | Van De Beek |

* cited by examiner

*Primary Examiner* — Daniel Washburn
*Assistant Examiner* — Rahel Guarino
(74) *Attorney, Agent, or Firm* — North Weber & Baugh LLP

(57) ABSTRACT

Embodiments of the present invention provide systems, devices and methods for modeling and correcting amplitude and quadrature phase errors generated within analog components of a receiver. A frequency-dependent correction method is employed that closely tracks the frequency dependent nature of the mismatch between the I and Q polyphase filter responses. In particular, digital correction is performed on a signal based on a modeled error function generated during a calibration of the receiver.

20 Claims, 17 Drawing Sheets

DIGITAL CORRECTION OF ANALOG POLYPHASE FILTERS

CROSS REFERENCE TO RELATED PATENT APPLICATIONS

This application claims priority to U.S. provisional application Ser. No. 61/391,034, entitled "Digital Correction of Analog Polyphase Filters," filed Oct. 7, 2010, which application is incorporated herein by reference in its entirety.

BACKGROUND

A. Technical Field

The present invention relates generally to compensation of amplitude and quadrature phase errors (including those generated by polyphase filters) generated within the analog, front-end of an RF receiver, and more particularly, to the correction of these errors in the digital and frequency domains within the receiver.

B. Background of the Invention

When designing highly integrated monolithic receivers, a significant challenge is the provision of channel selectivity. For direct conversion or zero-IF receivers, the channel selectivity is provided by symmetrical low-pass filtering after the quadrature down-conversion mixers. This filtering may comprise a combination of analog and digital filters such that the overall transfer function meets the desired selectivity requirements. It is important that strong interfering signals are sufficiently attenuated by the analog selectivity such that they do not exceed the linear range of analog-to-digital converters or of any of the analog stages in the baseband signal path.

Such direct conversion receivers present additional challenges in the form of:

(1) DC offsets that are by definition in the center of the desired passband
(2) 1/f noise, which can have high spectral density at the center of the passband; and
(3) 2nd order inter-modulation in the down-conversion mixers, which can cause interferers to mix with themselves to produce time-varying signals at baseband corresponding to the AM modulation envelope of the interferers in question.

Mitigation of these typical direct conversion problems forms a large part of the design effort when using direct conversion architectures; but in the case of narrow-band signaling formats, it is by no means certain that these parasitic in-band signals can be adequately suppressed. In such cases, it is common to consider low-IF (hereinafter, "LIF") or near-zero IF (hereinafter, "NZIF") receivers.

A low-IF receiver is often configured such that the image channel is also the left or right adjacent channel of the wanted signal, (i.e., the center frequency of the baseband signal is equal to half the channel spacing). In such a case, DC offset is just barely out-of-band as illustrated in FIG. 1.

A major advantage of the NZIF approach is that the unwanted issues described above, including the centered DC offset, are out-of-band. However, a challenge of the NZIF approach is that of obtaining sufficient image rejection selectivity. The use of low-pass filter centered around the DC offset will have an equal impact on both the wanted and unwanted image responses. Unless the ADCs have sufficient dynamic range to simultaneously handle the largest possible unwanted signal at the image frequency and a threshold sensitivity signal at the wanted signal, asymmetric analog filtering may be required. Such asymmetric filtering can be realized with a class of filters known as a poly-phase filter (PPF). The context and system architecture 210 for using polyphase filters 220 in a receiver as described above is illustrated in FIG. 2.

The term poly-phase filter means a filter that is created by the shift transform from its low-pass prototype, (i.e., $s \rightarrow (s-j\omega_\alpha)$) so that the frequency is no longer centered around the DC offset, but can be arranged such that passband is centered around the wanted signal at some positive frequency while rejecting an image response at a corresponding negative frequency. In a typical analog implementation, the frequency shifting transform cannot be realized with real components. However, in a quadrature down-conversion receiver architecture with differential signals for I and Q, all four quadrature phases of the received signal are available, making it possible to implement polyphase filter topologies.

In order to calculate a frequency response, a phase relationship is defined between the 2 input ports 310, 320 (or 4 input terminals) of the network as shown in FIG. 3. For illustrative purposes only, assume that for a positive frequency the relative phase of inputs to R1 330, R2 331, R3 332, and R4 333 are 0, 90, 180 and 270 degrees respectively. FIG. 4 illustrates a calculated frequency response 410 of the network in FIG. 3 assuming all of the resistors are 50 ohms and all of the capacitors are 5 picofarads.

One skilled in the art will recognize that a major problem with this kind of polyphase filter is the reliance on cancelation to obtain a desired stop-band rejection. The degree of cancellation is effectively dependent on statistical component matching, which is a problem that cannot be entirely eliminated with analog filter elements.

The problems caused by mismatch become more apparent when considering a higher order bandpass filter. As an example, consider a 4-pole Butterworth active polyphase filter, based on two cascaded Tow-Thomas biquad sections. FIG. 5 illustrate an exemplary single section 510 of the filter (i.e., the bi-quad filter would have another section in series to the one illustrated in FIG. 5). For purposes of illustration, fully differential op-amps are represented by ideal voltage-controlled voltage sources 520 each with a voltage gain of $-10^5$.

For purposes of comparison, FIG. 6 illustrates a response 610 in which nominal component deviation is used. In order to investigate the impact of component tolerances, each R and each C is assigned a 2% standard deviation. FIG. 7 illustrates a Monte Carlo simulation of the filter response 710 in which 1,100 trials were performed with the 2% standard deviation being randomly generated across the components within the filter. FIG. 8 illustrates a further Monte Carlo simulation of the filter 810 in which 100 trials were performed within the same 2% standard deviation being randomly generated across the components. One skilled in the art will recognize the unwanted image responses 720, 820 located on the left side of the passband.

As can be observed from the unwanted image responses 720 and 820, the image rejection of the polyphase filter can be significantly degraded when statistical variation of component tolerances is considered, so that the amount of image rejection that can be relied upon is significantly reduced.

Worse still, it should be noted that the above analysis only measures one frequency at a time during the frequency sweep. Under conditions of component mismatch, not only is the amount of attenuation at the negative frequencies reduced, but there is a propensity to also create a positive frequency component at the same time, due to the fact that filter responses at output ports 1 and 2 are no longer identical. This is because for any given Monte Carlo trial, the filter responses (especially in the rejection band) can be very different and can be more graphically illustrated by viewing the corresponding plots for a single trial shown in FIGS. 9A and 9B.

At some frequencies, there is a very significant mismatch, and at other frequencies there is a closer match. The matching in the passband tends to be much better than the matching in the intended stop-band, where the amplitude response is highly dependent on the degree of cancellation that is achieved between nominally identical components.

Essentially, the problem that arises is one of frequency-dependent I/Q mismatch, both amplitude mismatch and quadrature phase error. Notably in the stop-band, the amplitudes of the I and Q components are no longer identical after filtering and the relative phase offset between them is no longer 90 degrees. This effectively prevents further filtering from improving the stop-band rejection unless some corrective measures are considered.

The idea of using FFT techniques to measure and compensate for frequency-dependent mismatch is known in the art, particularly in the context of OFDM communications systems, where frequency domain processing particularly convenient utilizing the existing IFFT and FFT processors that are inherently needed in the signal path. What is now needed is a system and method to assess and apply complex, frequency-dependent correction to an arbitrary time-domain signal and preferably to apply the run-time correction entirely in the time-domain, especially for signals that do not inherently require frequency domain processing. This technique will be particularly valuable for overcoming the mismatch errors introduced by analog polyphase filters, but can be generally applied to frequency-dependent quadrature and amplitude errors from a variety of sources.

SUMMARY OF THE INVENTION

Embodiments of the present invention provide systems, devices and methods for modeling and correcting amplitude and quadrature phase errors generated within analog components of a receiver. A frequency-dependent correction method is employed that evaluates the frequency dependent nature of the mismatch between the I and Q polyphase filter responses. In particular, digital correction is performed on a signal based on a modeled error function generated during a calibration of the receiver. Effectively, error generated within analog components of the baseband signal path, including polyphase filters, is corrected after the signal is converted to a digital signal but before the signal is processed by a digital demodulator to recover the information content. Unwanted frequency components, such as image tone coefficients, are filtered using frequency domain or time domain digital filtering techniques and in accordance with the modeled error within the receiver. In an embodiment, detection of the frequency-dependent complex frequency response errors occurs in the frequency domain using Discrete Fourier Transform techniques to generate and measure orthogonal tones, whereas run-time correction uses linear convolution either in the frequency domain (e.g., using overlap-save processing) or in the time domain using an equivalent FIR filter. In certain embodiments, the complex frequency domain error is measured at start-up. In certain examples, this error may be updated during runtime of the receiver to further compensate for drift in the error.

Some features and advantages of the invention have been generally described in this summary section; however, additional features, advantages and embodiments are presented herein or will be apparent to one of ordinary skill in the art in view of the drawings, specification, and claims hereof. Accordingly, it should be understood that the scope of the invention shall not be limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different electrical components, circuits, devices and systems. The embodiments of the present invention may function in various different types of environments wherein error compensation is relevant including RF receivers. Structures and devices shown below in block diagram form are illustrative of exemplary embodiments of the invention and are meant to avoid obscuring the invention. Furthermore, connections between components within the figures are not intended to be limited to direct connections. Rather, connections between these components may be modified, re-formatted or otherwise changed by intermediary components.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

Figure 1:
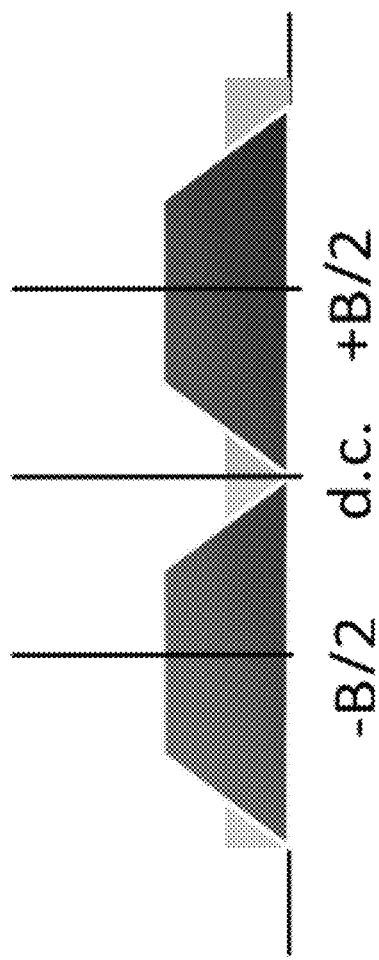
FIG. 1 illustrates an example of non-zero IF wanted and image channels centered around a DC offset.
Figure 2:
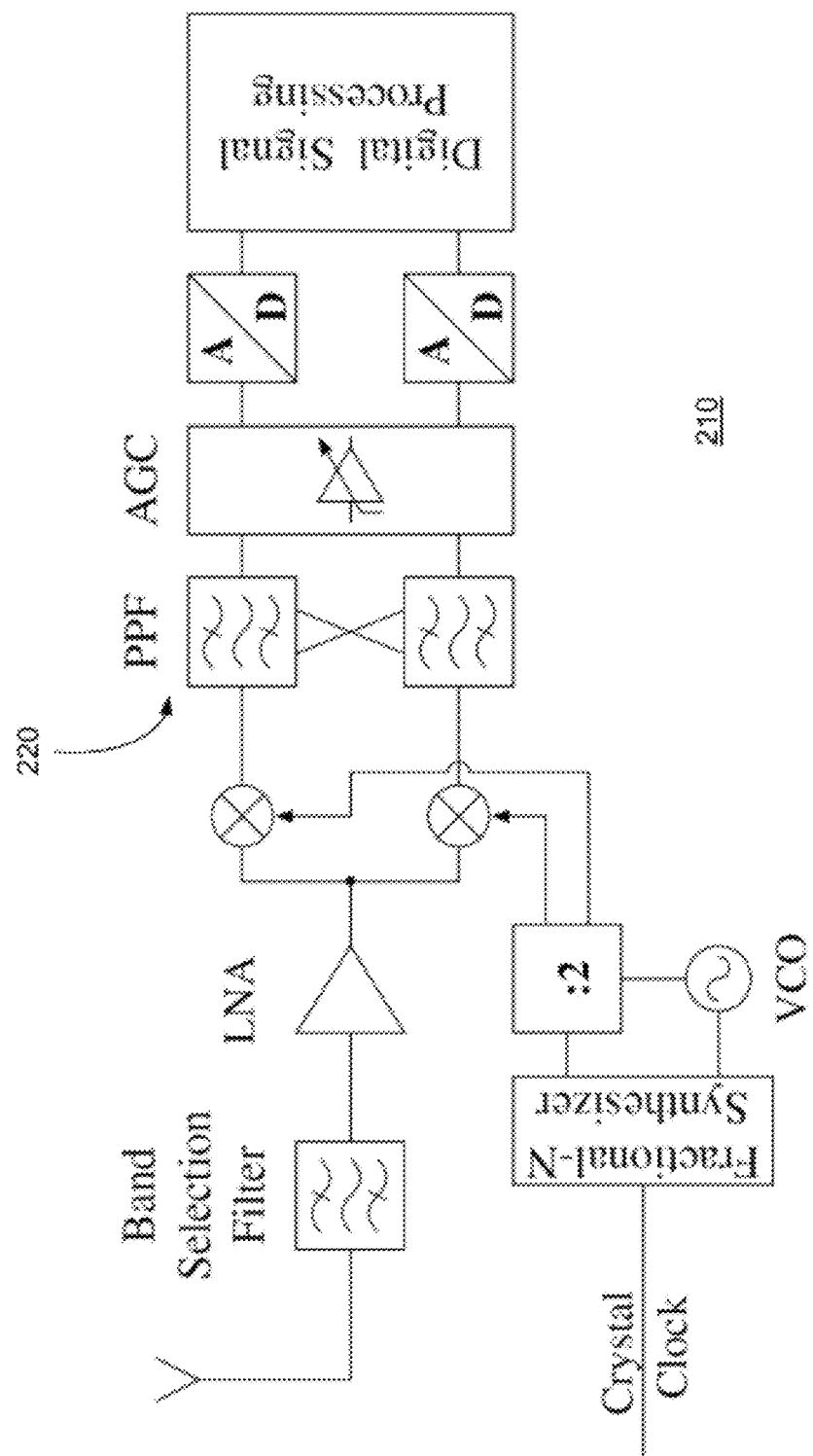
FIG. 2 is a general illustration of a prior art receiver architecture using polyphase filters.
Figure 3:
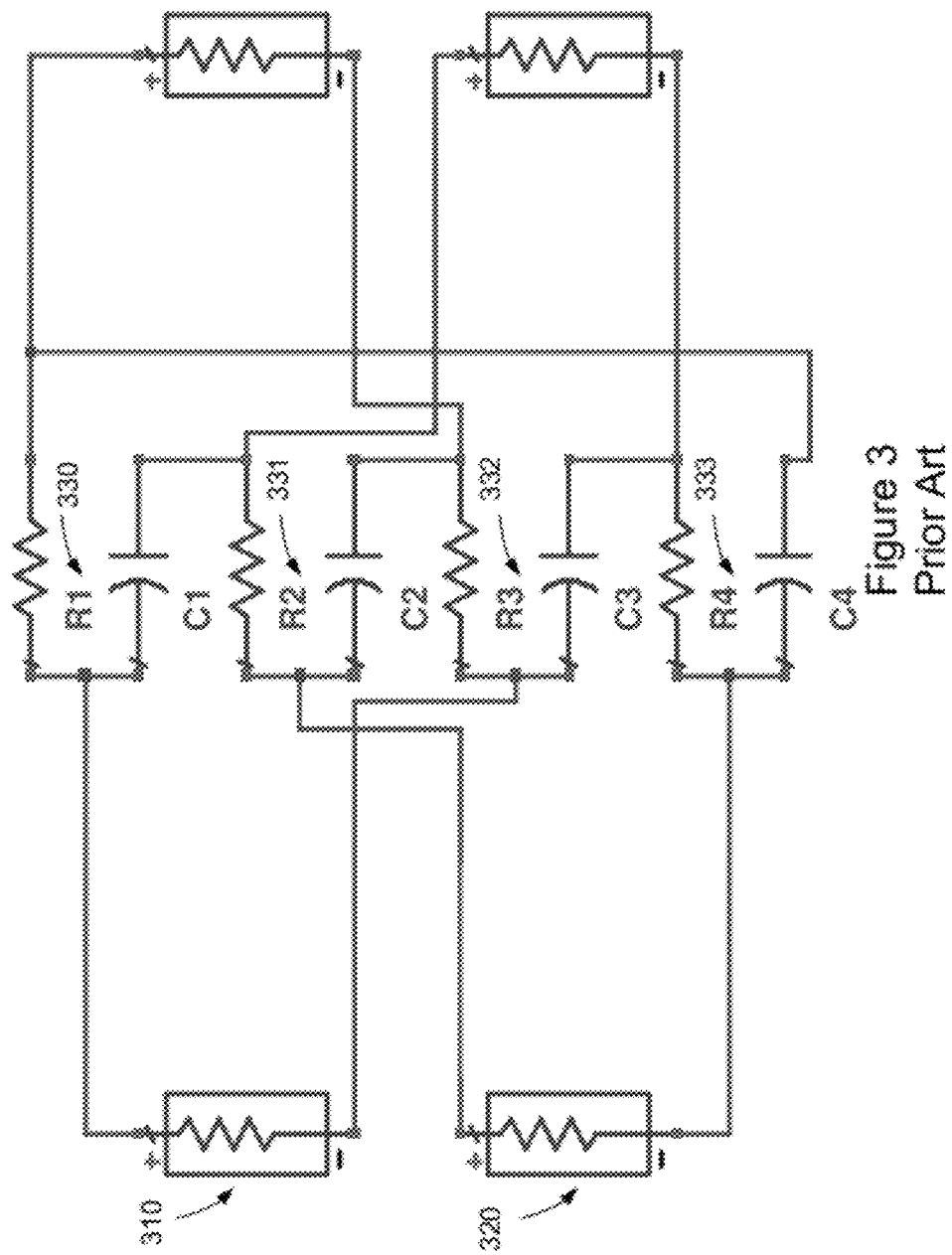
FIG. 3 is a simple, passive polyphase RC filter known in the prior art.
Figure 4:
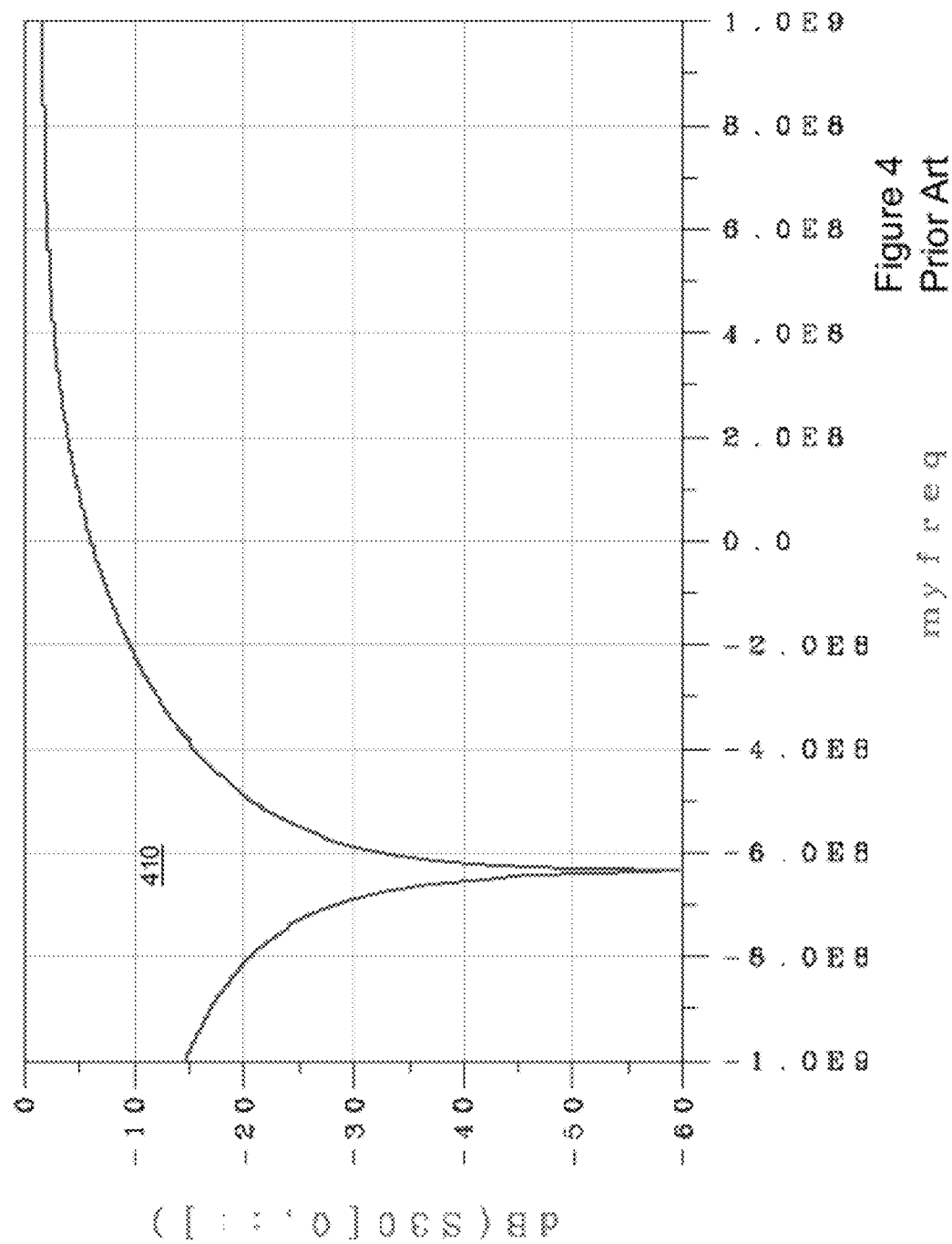
FIG. 4 illustrates a calculated frequency response of the polyphase RC filter in FIG. 3.
Figure 5:
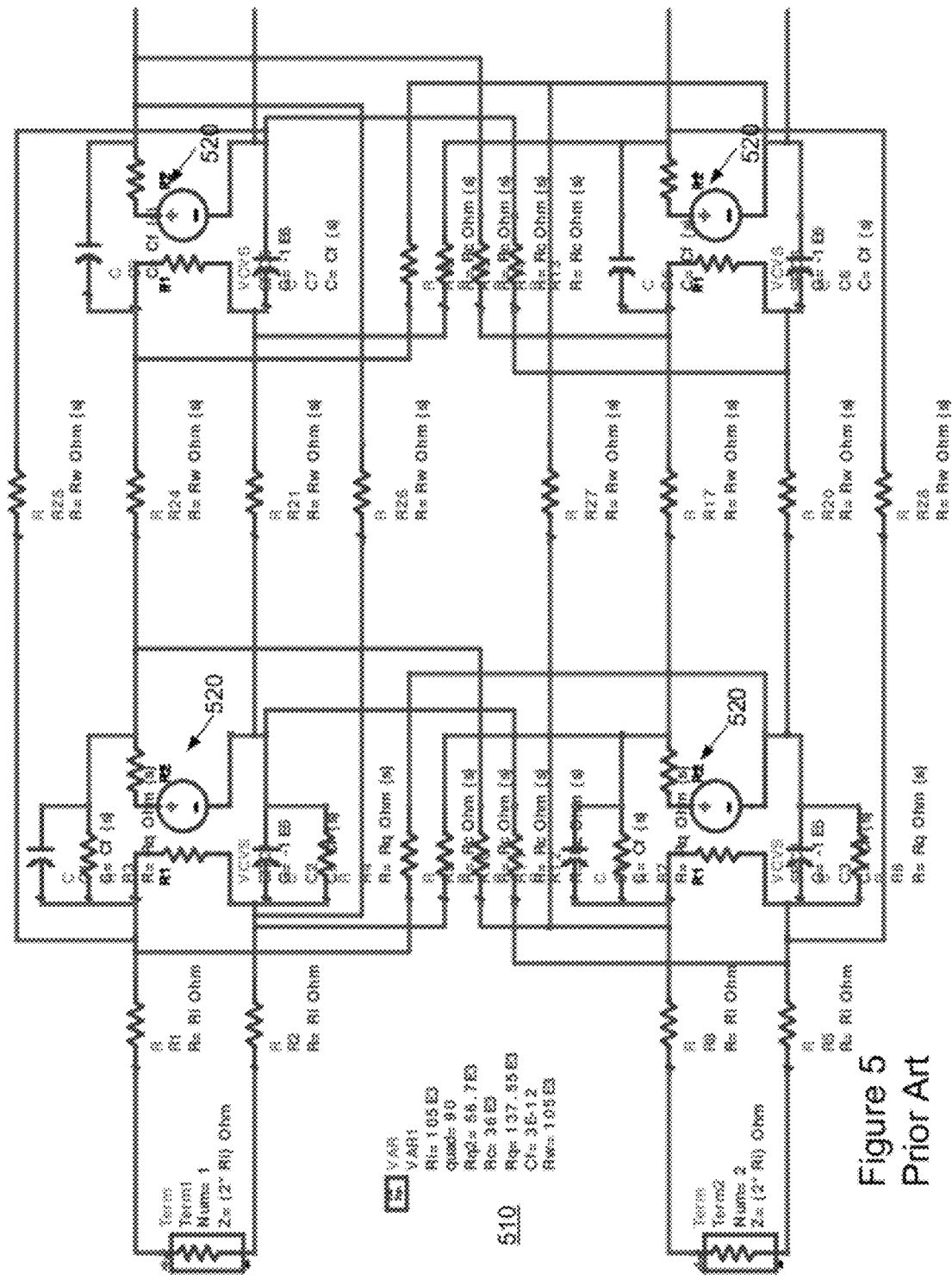
FIG. 5 is a circuit diagram of a Tow-Thomas BiQuad Section known to one of skill in the art.
Figure 6:
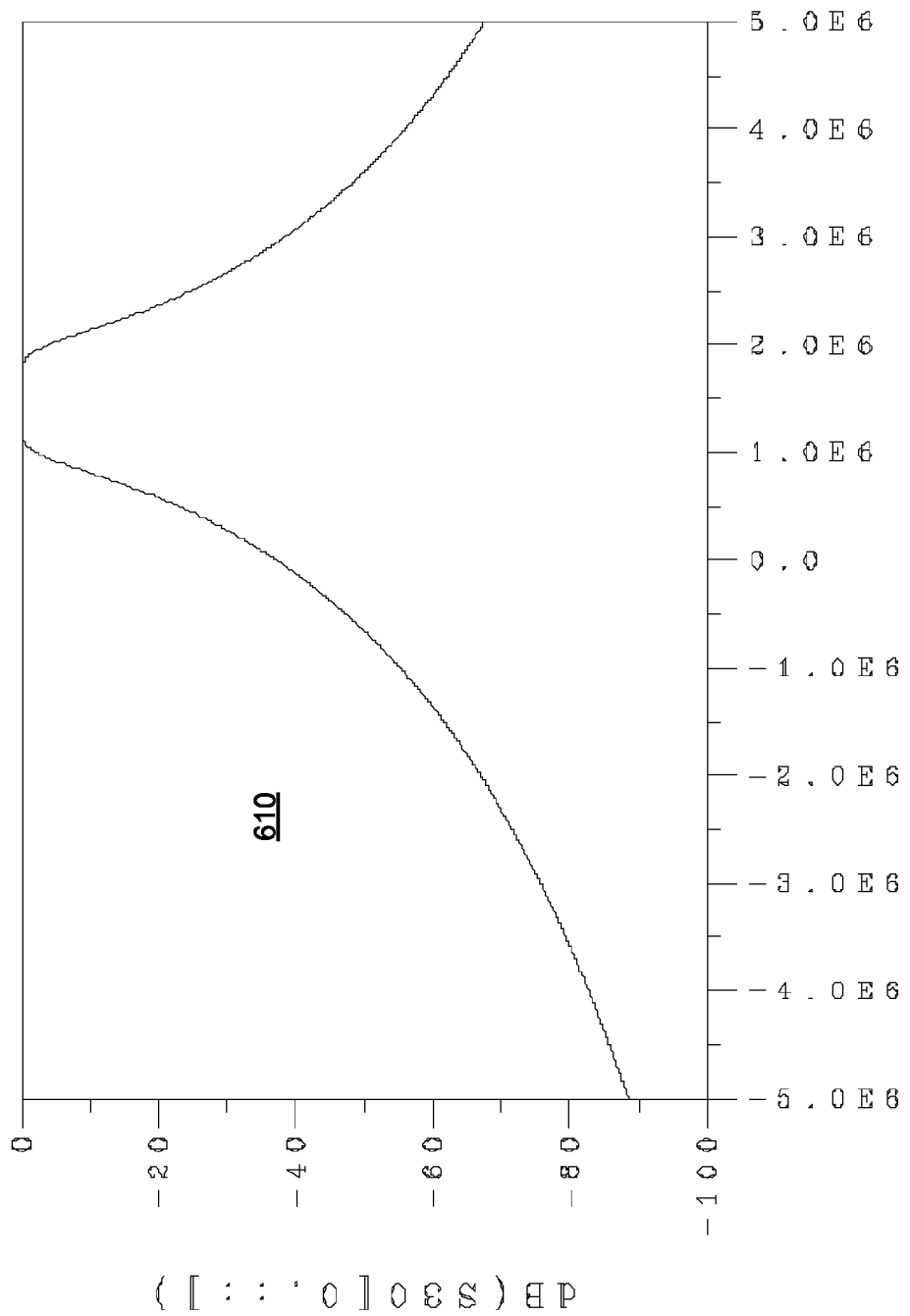
FIG. 6 is a representative polyphase filter response in which nominal component values are used in the model.
Figure 7:
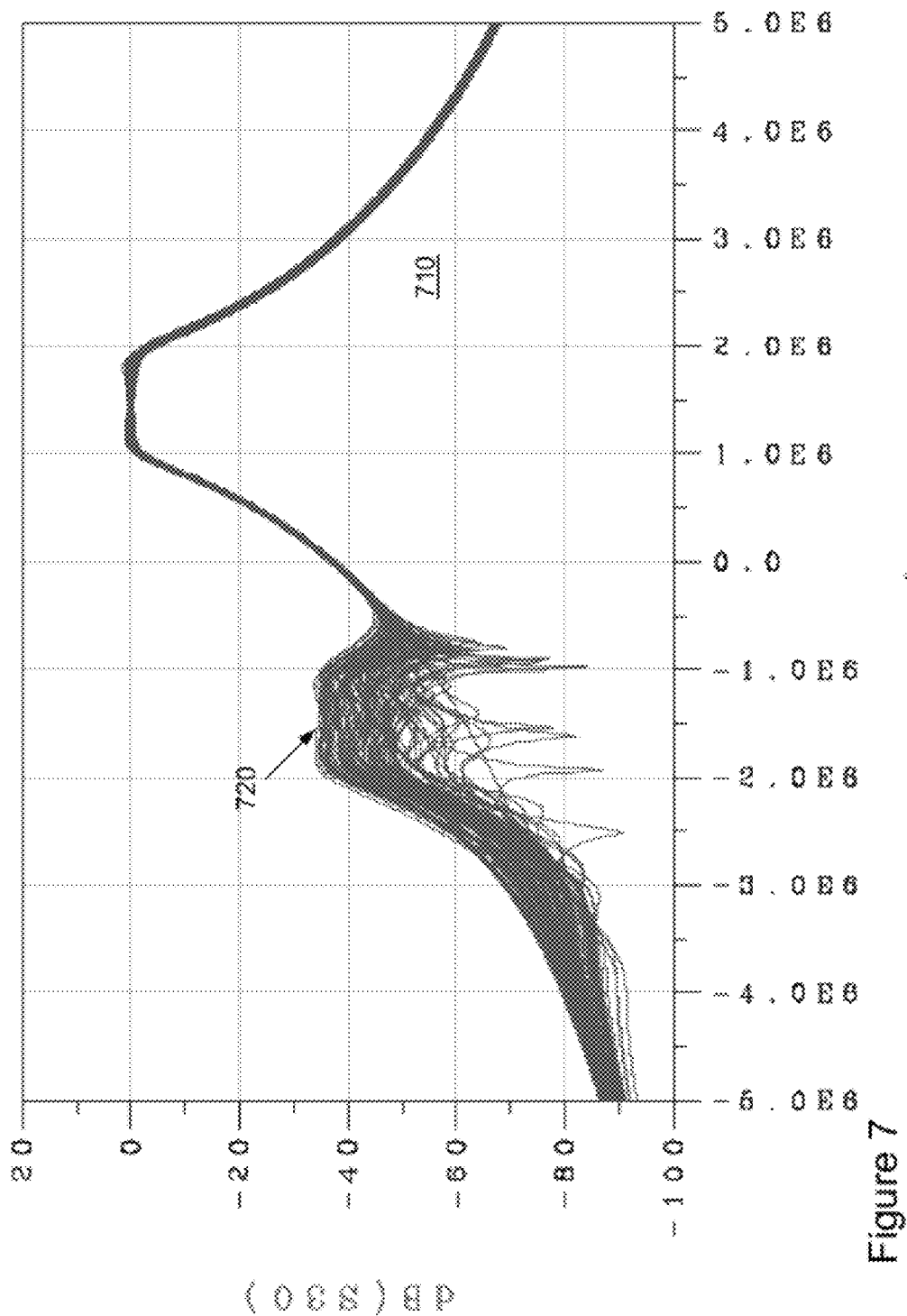
FIG. 7 is a first representative polyphase filter response in which multiple trials are plotted using randomly generated component values within a standard deviation of two percent.
Figure 8:
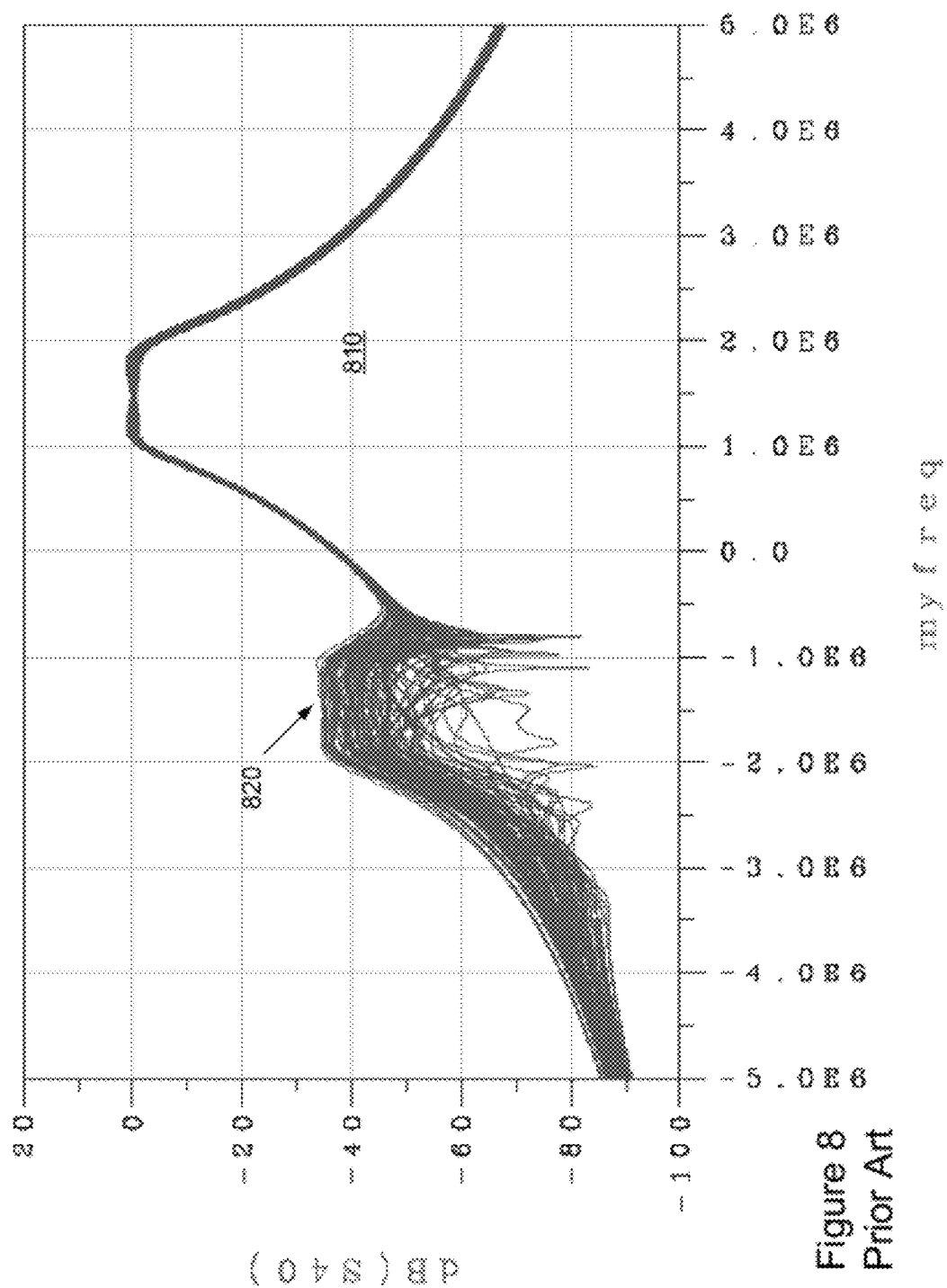
FIG. 8 is a second representative polyphase filter response in which multiple trials are plotted using randomly generated component values within a standard deviation of two percent.
Figure 9A:
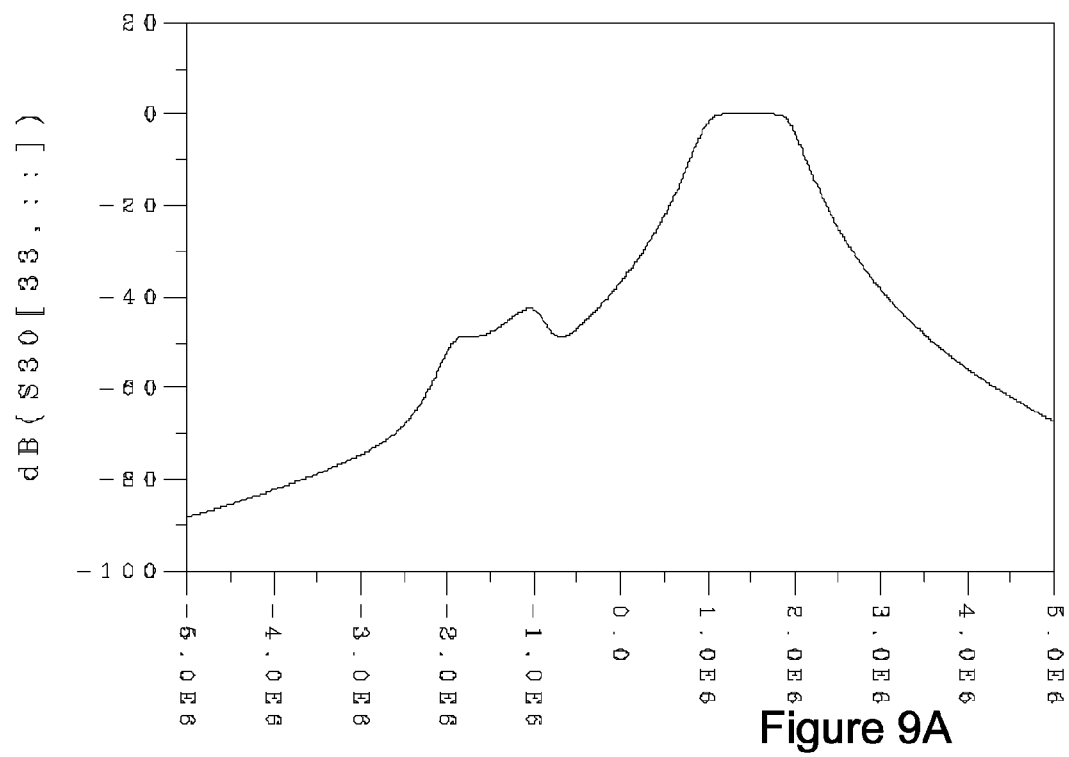
FIGS. 9A and 9B illustrate the difference between the image reject responses between port 1 and port 2 plotted in FIG. 8.
Figure 9B:
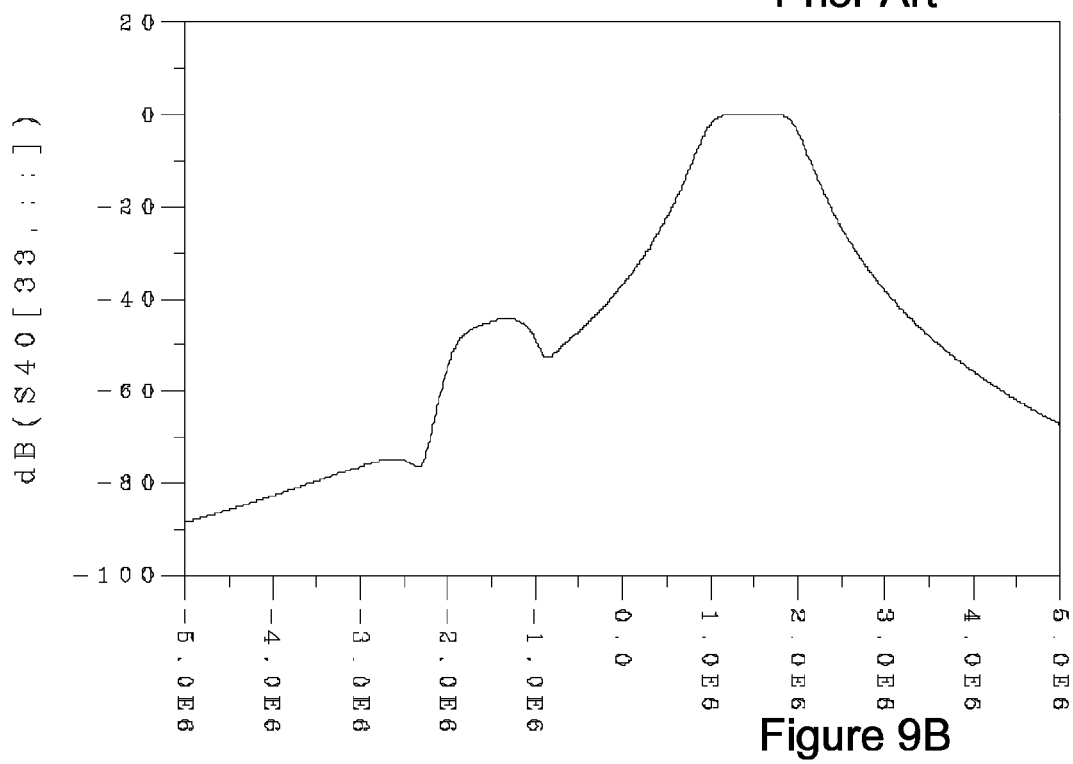
Figure 10:
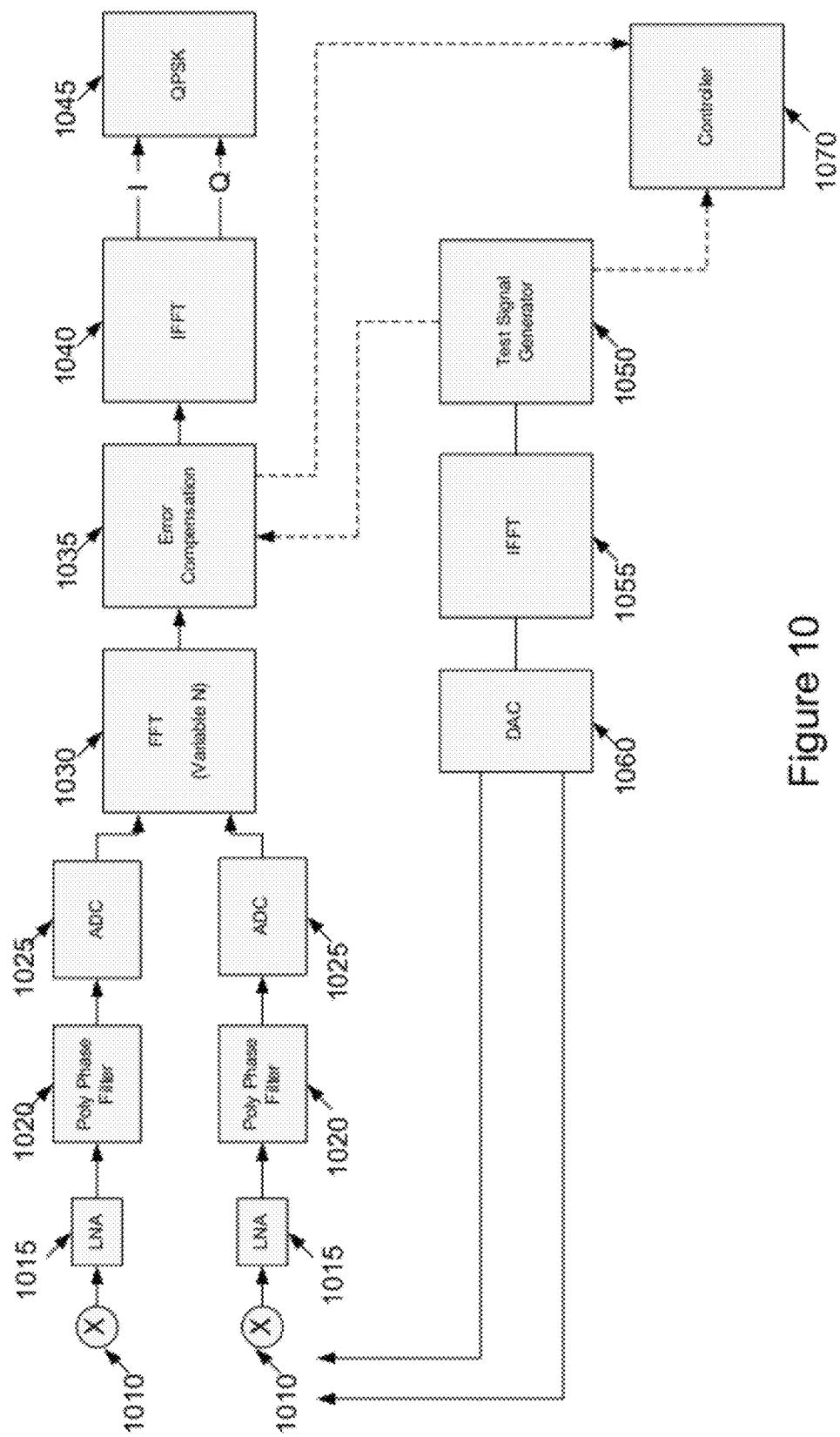
FIG. 10 is a receiver architecture providing digital correction for errors generated in analog components, including polyphase filters, within the receiver according to various embodiments of the invention.

FIG. 10 illustrates an exemplary system for correcting both quadrature and gain errors within a receiver employing polyphase filters according to various embodiments of the invention. As shown, the receiver includes a low noise amplifier 1010, mixers 1015 and polyphase filter 1020 in an analog baseband signal path of the receiver. As previously described, these components, especially the polyphase filter, generate both amplitude and quadrature phase errors.

Analog-to-digital converters 1025 convert the analog signals, including the errors generated therein, into corresponding digital signals. For the purpose of evaluation of the complex error response of the system, these digital signals are changed into the frequency domain such that a plurality of frequency coefficients is generated by the application of a Fourier Transform 1030 to the digital signals. In certain embodiments, the spacing, or number of frequency bands (N), used within the transform may be adjusted to balance the processing costs of performing the transform relative to the accuracy of the transform itself. In some embodiments, it is not convenient to process the main modulation content of the signal in the frequency domain (OFDM being a notable exception). In these cases a purely time-domain signal path is provided for the correction, as illustrated in FIG. 10. In this case, the FFT processing is retained purely for the assessment of the necessary frequency-dependent correction at start-up, and other opportunities when the main signal path is not in use. In other embodiments, FFT processing may be also used as means to perform "fast convolution" using overlap-save or overlap-add methods known to those skilled in the art; these being mathematically equivalent to an FIR filter being applied in the time domain. The flexibility to apply run time correction in the most convenient domain for the implementation is part of the advantage conferred by the present invention.

The frequency domain samples are provided to an FIR coefficient computation module 1037 that that first estimates the complex frequency domain coefficients β(n) described hereafter and then transforms them into FIR coefficients using any suitable filter design technique, including direct computation of the coefficients using an inverse discrete Fourier transform. Effectively, a correction procedure is employed that uses a previously calibrated model of the gain and quadrature phase errors and mathematically corrects for these errors. An objective of the error compensation module is the removal of image tones generated within the polyphase filters.

In order to properly estimate errors generated within the analog components, a calibration process is performed. In various embodiments of the invention, a test signal generator 1050 generates a test signal used to measure the error. In certain examples, a first orthogonal multi-tone test signal having only positive tones is used to identify corresponding erroneous negative tones that are generated and a second test signal having only negative tones is used to identify corresponding erroneous positive tones. As a result, both positive and negative tones can be measured and calibrated using the combination of the two test signals. In other embodiments a single tone may be used, under a control mechanism to sequence through the desired sequence of tone positions using a fractionally spaced synthesizer or other device to control the tone frequency accurately. It is important that the method used to up-convert the test tones to the receiver frequency band be largely free of quadrature error, which tends to favor the use of single branch transmitter structures rather than quadrature up-conversion. A single tone generator has the advantage that it need not rely on quadrature up-conversion and therefore doesn't suffer from mismatch errors, but has the disadvantage that it must serially visit each frequency of interest. One skilled in the art will recognize that various permutations of multi-tone baseband generator and frequency shifting using a synthesizer may be used to efficiently generate test signals and that the test signals may be adapted to focus on certain critical sub-bands of interest containing the most important errors within the baseband data path.

In certain embodiments, the test signal is generated as a plurality of frequency coefficients and is subsequently converted into the time domain using an inverse Fourier Transform 1055. The resulting digital signal is converted to an analog signal using a digital-to-analog converter 1060 and inserted within the baseband data path of the receiver. Such a test signal depends on the quadrature accuracy and amplitude matching of the up-conversion signal path, which may require additional calibration methods to avoid excessively biasing the receiver calibration measurements. In the case where such additional calibration is not desirable or feasible, real signals may created and shifted into the negative and positive frequency halves of the receiver passband using an independent frequency synthesis circuit. In various embodiments, an analog test signal is directly generated at radio frequencies and inserted in front of the receiver down-conversion mixers so that errors generated in the mixers, amplifiers, polyphase filters, and data converters may be detected and quantified.

The test signal then propagates through the analog components resulting in error being generated therein. This test signal, having errors, is then converted to a digital signal and has a Fourier Transform applied thereto. The error compensation module receives the corresponding frequency coefficients, including those mirror-image frequency coefficients generated by quadrature errors or mismatches. In one embodiment of the invention, the error compensation module has logic that processes these frequency coefficients to the test signal such that error characteristics are identified. In other embodiments, a controller 1070 or other processing logic receives both the test signal and the frequency coefficients (having the generated error) such that the error on the test signal can be calculated at each distinct frequency of interest.

Once the error is modeled, the error compensation module can correct the error by the application of a mathematical operation(s) that effectively remove the error from the signal within the digital and frequency domains.

One skilled in the art will recognize that this calibration procedure may be performed during startup of the receiver. In certain embodiments, the error compensation module 1035 may be tuned to compensate for error drift by running the calibration procedure during down times in operation A more detailed explanation and graphical illustration of the error correction is provided below.

In analyzing the non-frequency selective relative gain and phase errors, for illustration consider a complex baseband, discrete-time signal, where the kth sample is given by $C(k) = \exp(i\omega k\Delta t)$. This signal is intended to represent a complex tone, or a continuous wave signal as observed in the baseband of a quadrature ZIF or NZIF receiver. The skew due to gain imbalance and quadrature errors can be represented by a single complex coefficient, $\beta$ and the following notation indicates how the gain and quadrature error may be modeled mathematically for the kth sample:

$$D(k)=C(k)+\beta C^-(k)$$

This holds for any arbitrary complex discrete time signal, COO, and where $C^-(k)$ represents the complex conjugate of the corresponding sample.

Figure 11:
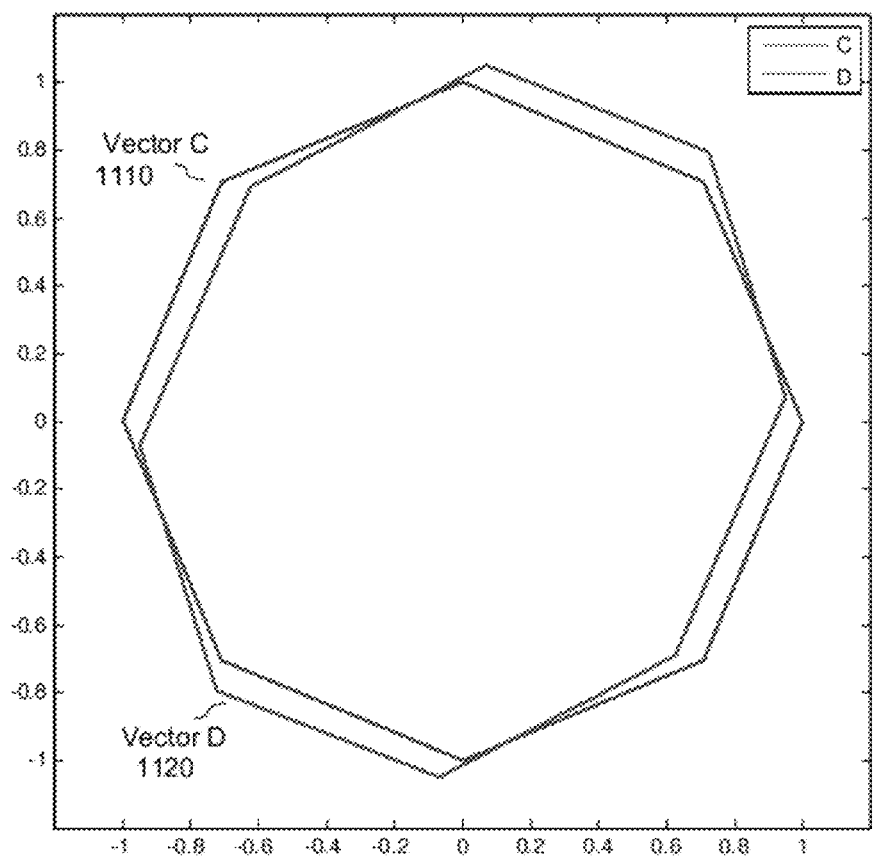
FIG. 11 is a plot illustrating the impact of quadrature skew functions on the signal within the complex plane.

For the purpose of illustration and referring to FIG. 11, let $$\omega \Delta t = \frac{\pi}{4},$$

and let k=0, 1, 2, ..., 1023. Therefore, the vector $\overline{C}$ 1110 is of length 1024 and contains 128 cycles of the complex wave. For this illustrative example, we let $\beta=-0.05+0.07$ i and FIG. 11 shows the impact of the quadrature skew function on the signal in the complex plane. A first trace shows the vector $\overline{C}$ 1110 with no skew applied while a second trace shows the vector $\overline{D}$ 1120 computed as described above.

Figure 12A:
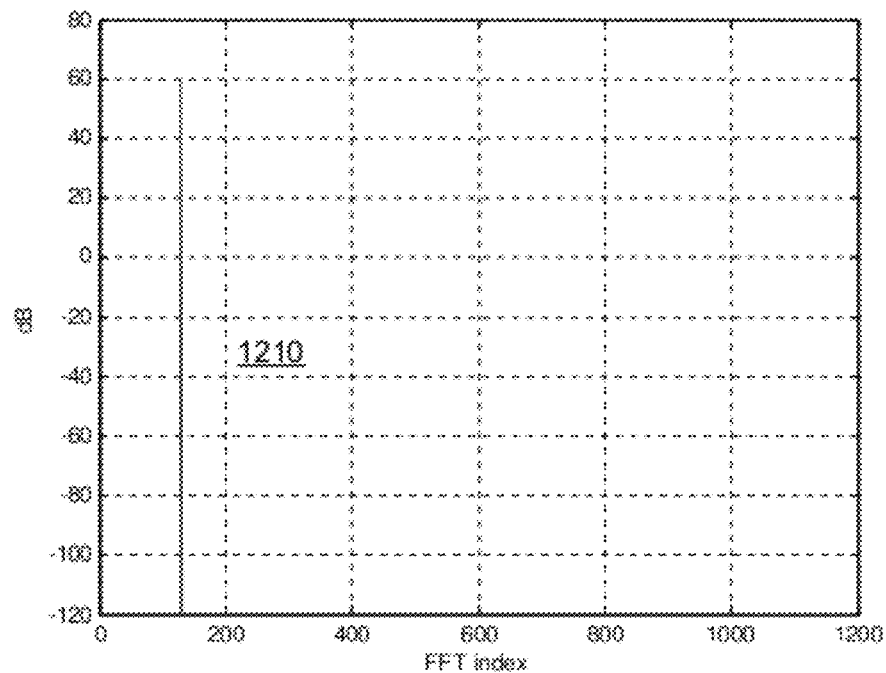
FIGS. 12A and 12B illustrate the frequency component and generation of an erroneous image tone caused by gain and phase mismatch.
Figure 12B:
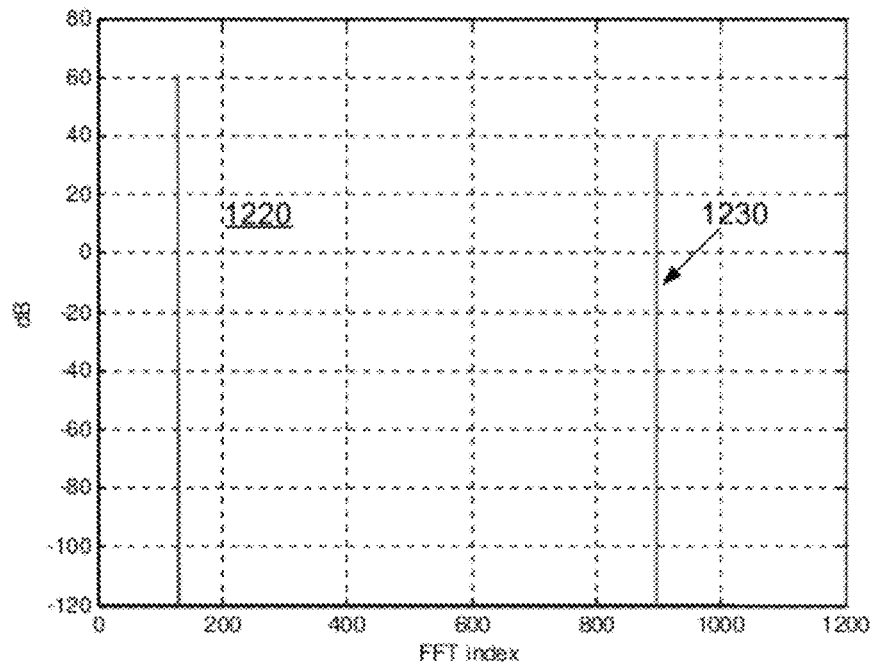

It is revealing to take the FFT of these two signals to observe the impact in the frequency domain. FIG. 12A illustrates a frequency domain plot 1210 of vector C and FIG. 12B illustrates a frequency domain plot 1220 of vector D. One skilled in the art will recognize the error within vector D that includes the erroneous image tone 1230 located at about 900 on the frequency spectrum. Note also that the image tone that appears in FIG. 12B is entirely due to the gain and phase mismatch modeled by the complex coefficient $\beta$. An important implication of this is that that the complex value of the image tone can be used directly to estimate the value of the complex quadrature skew coefficient.

$$\overline{FD}=FFT(\overline{D})$$

If the desired component in the frequency domain is FD(n), the undesired image component will be found as FD(N−n), where N is the length of the FFT chosen and the complex value of that image tone can be found as:

$$FD(N-n)=\beta \cdot FD^*(n),$$

where $FD^*(n)$ is the complex conjugate of the desired tone value in the $n^{th}$ frequency bin.

Thus, an estimation of the complex quadrature skew coefficient can be determined purely from an observation of the FFT of the distorted test tone, i.e., from $\overline{FD}$. Specifically, $$\beta = \frac{\mathcal{F}D(N-n)}{\mathcal{F}D^*(n)}$$

Thus, the potentially unknown complex quadrature skew coefficient can be recovered by means of a simple frequency domain computation.

At present we are considering frequency-independent quadrature gain and phase errors, but later we will use a similar technique for frequency-dependent errors. Therefore, a generalization of the estimation equation may be:

$$\beta(n) = \frac{\mathcal{F}D(N-n)}{\mathcal{F}D^*(n)}$$

This allows the correction information to be stored as a vector of complex coefficients, $\overline{\beta}$ of length N and corresponding correction methods to be performed on the signal.

For purposes of correction within the time domain, given the proposed model of non-frequency selective quadrature skew as: $D(k)=C(k)+\beta C^*(k)$, it is a matter of algebra to isolate the wanted C(k) if $\beta$ and D(k) are known.

$$\hat{C}(k) = \frac{D(k) - \beta D^*(k)}{1 - \beta\beta^*}$$

Note that the denominator expression is a real scale factor, and is not needed to restore the ideal quadrature of the signal. Depending on the circumstances, it may not be a necessary step to restore the amplitude in this manner. If it is known that the skew due to gain imbalance and quadrature error is largely frequency independent, then the above equation may serve as the appropriate correction mechanism. In this case, the FFT if used and the above equation is only needed for parameter estimation.

For purposes of correction within the frequency domain, a similar technique can be applied. Consider that each desired tone at FC(n) produces an unwanted additional image tone FD(N−n)=FC(N−n)+$\beta$FC*(n). In the case where only the distorted frequency domain vector, $\overline{FD}$ is available, the inverse operation can be applied in the frequency domain as follows:

$$\mathcal{F}\hat{C}(n) = \frac{\mathcal{F}D(n) - \beta\mathcal{F}D^*(N-n)}{1 - \beta\beta^*} n = 0, 1 \ldots N-1$$

Again, it will be advantageous to generalize this to a vector $\overline{\beta}$, and use a subscripted $\beta(n)$ to allow for the case of frequency-dependent quadrature mismatch. To do so, a similar derivation to the time-domain quadrature mismatch correction is performed, and the different indexes of the elements of vector $\overline{\beta}$ are tracked:

$$FD(N-n)=FC(N-n)+\beta(n)FC^*(n)$$

$$FD(n)=FC(n)+\beta(N-n)FC^*(N-n),$$

which, can be manipulated to yield the corrected frequency domain response:

$$\mathcal{F}\hat{C}(n) = \frac{\mathcal{F}D(n) - \beta(N-n)\mathcal{F}D^*(N-n)}{1 - \beta(N-n)\beta^*(n)}$$

It is important to avoid near division by zero, e.g., when $$n = \frac{N}{2},$$

and therefore N−n=n. In some cases it may be better to avoid division by the denominator term altogether, in which case a certain amount of frequency-domain amplitude and phase ripple will remain after the correction (unless further corrected by a linear equalizer), The structure of the numerator for the corrected frequency-domain signal deserves further consideration. $\overline{FC}(n) \approx FD(n) - \beta(N-n)FD^*(N-n)$ It can be deduced that the corrected frequency domain signal is given by the available disturbed frequency domain signal minus a frequency-domain filtered version of the complex conjugate of the disturbed frequency signal. If the signals are already available in the frequency domain, such as in an OFDM transmission system, this gives rise to a convenient and rather trivial correction computation suggested by the above equation. However, in the case where time-domain correction of a continuous stream of signal samples is required, direct application of the above equation will result in circular convolution of the conjugate of incoming signal with the coefficient vector β whereas linear convolution is necessary for accurate filtering of a continuous stream of input samples. Therefore, a useful and novel generalization of the correction technique is to take the frequency domain filter represented by the vector β and apply it as a linear filter to a continuous incoming stream of conjugated signal samples, either using overlap-add or overlap-save techniques to avoid unwanted pollution of samples at the edges of the convolution blocks. This leads to a preferred embodiment wherein the entire frequency-domain computation is replaced with an equivalent complex FIR filter implemented in the discrete time domain. This deduction results in a simplified run-time correction method and circuit as shown in FIG. 10. Nevertheless, an equivalent method using "fast convolution" in the frequency domain may be preferable when the number of coefficients is very large, or when frequency domain processing is convenient for other reasons.

Figure 13A:
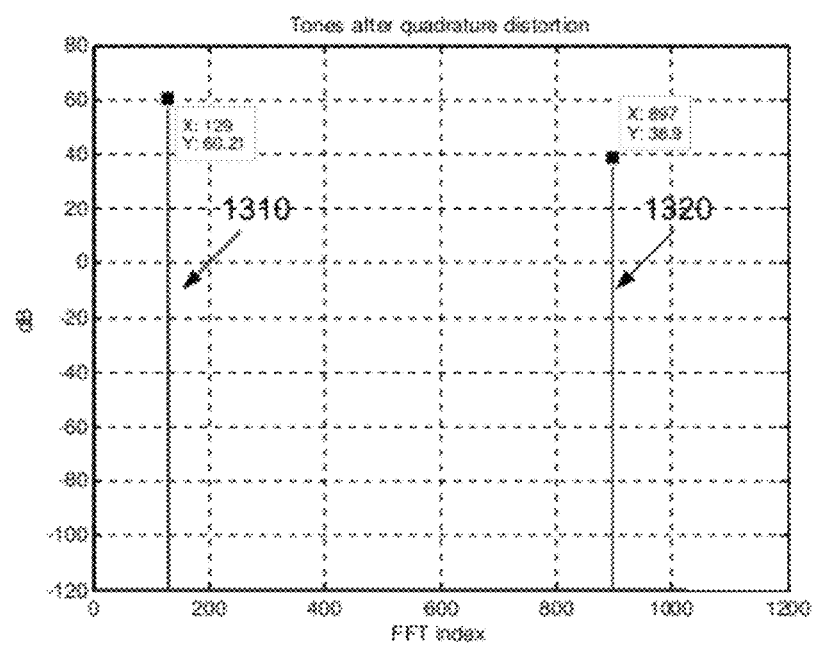
FIGS. 13A and 13B illustrate before and after plots of frequency domain quadrature correction according to various embodiments of the invention.
Figure 13B:
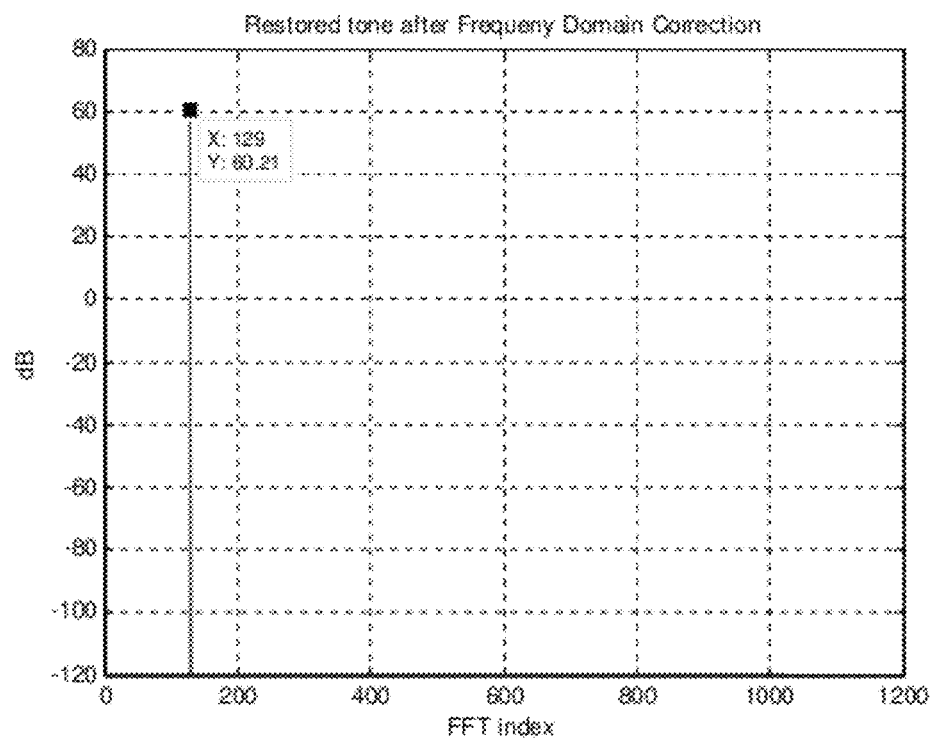

FIGS. 13A and 13B demonstrate the introduction of non-frequency selective quadrature skew and its removal in the frequency domain according to various embodiments of the invention. In this example, a complex test tone signal applies a complex quadrature skew in the time domain to create a quadrature-skewed test tone signal. A frequency domain correction is applied using the a priori known complex quadrature skew coefficient resulting in the removal of the unwanted and erroneous image tone as shown in FIG. 13B.

For illustrative purposes, a test case with a practical polyphase filter topology is discussed. As discussed above, a method of estimating the frequency dependent complex correction coefficients and the ability to apply the prescribed correction in the frequency domain results in meaningful removal of errors within the signal. It is of interest to validate the proposed algorithms with the Monte Carlo calculated s-parameters of the Tow-Thomas biquad implementation of the Butterworth filter described earlier. To this end, 100 sets of 4-port s-parameters from the ADS circuit simulation are discussed below.

As a first step, the complex frequency domain s-parameters were converted to digital HR filters with real-valued tap weights. Of the 16 possible s-parameters, only {S(3,1), S(3, 2), S(4,1), S(4,2)} were utilized. The transformation of the frequency domain s-parameter sweeps into a time-domain impulse response is achieved using an IFFT function call using both the original frequency domain vector and an appended complex-conjugate, reverse-order copy to ensure the resulting FIR coefficients are real.

The resulting digital FIR filters were characterized to show the set of complex frequency responses are as expected from the original ADS linear s-parameter simulation.

A multitone signal is created for test purposes containing 2 unwanted tones in the stop-band of the polyphase filter which are each 20 dB higher magnitude than a wanted tone nominally in the pass-band of the polyphase filter. A d.c. term was also added. These time-domain tones are summed and passed through the each Monte-Carlo variation of the digital filter shown in FIG. 14.

Figure 14:
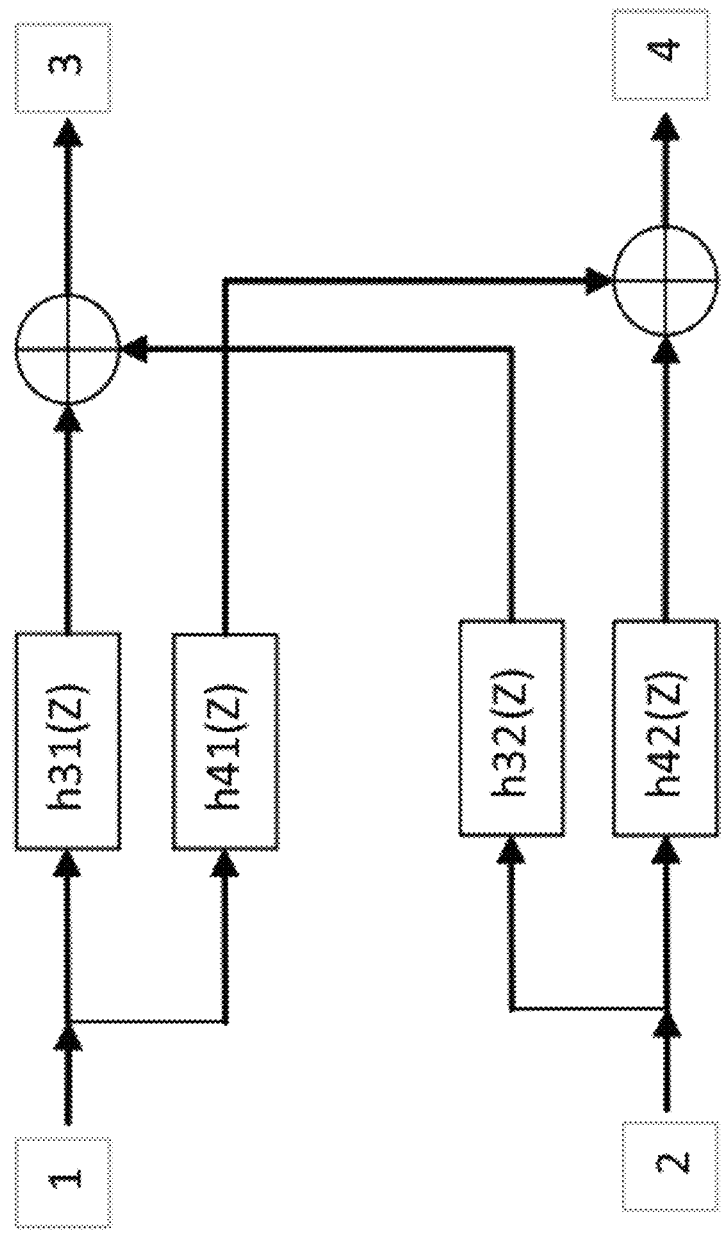
FIG. 14 is a Z-domain FIR representation of an analog polyphase filter.
Figure 15A:
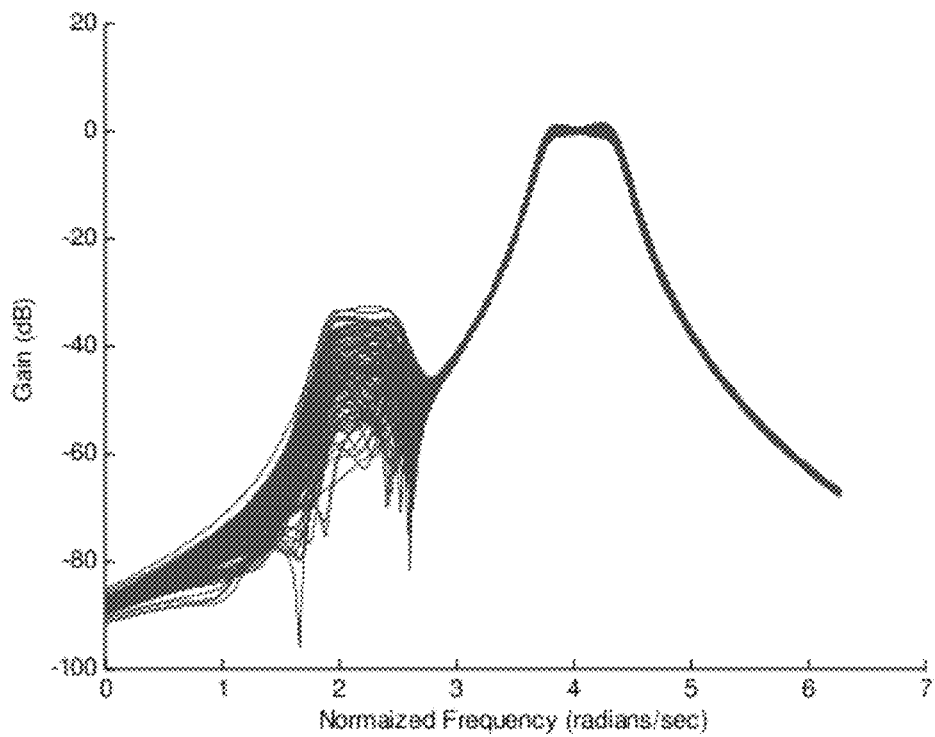
FIGS. 15A and 15B are plots illustrating the digital filter response of different ports on the polyphase filter.
Figure 15B:
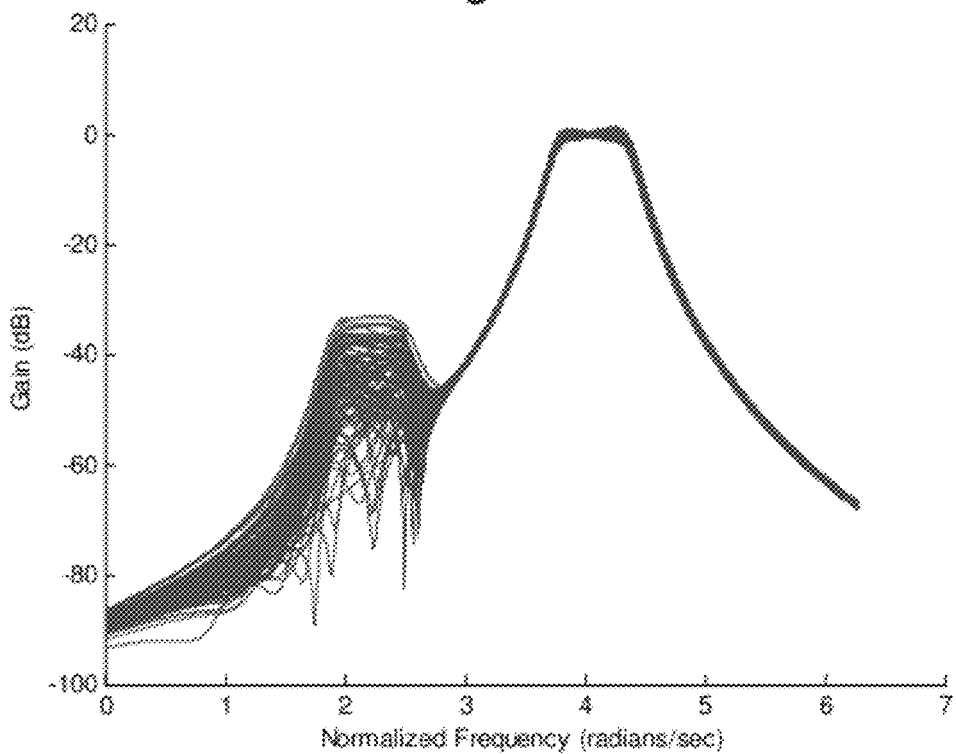
Figure 16A:
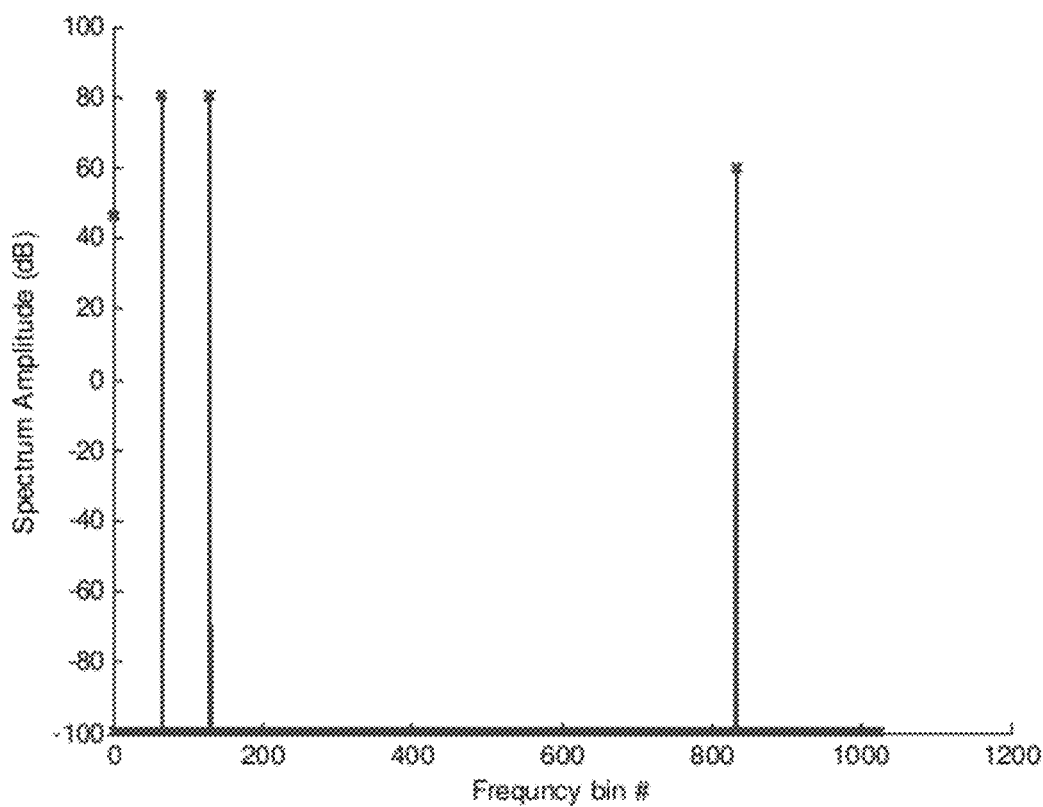
FIGS. 16A and 16B are plots illustrating an exemplary multi-tone test signal within the frequency domain and the result of passing the test signal through a polyphase filter (performed multiple times on the plot).
Figure 16B:
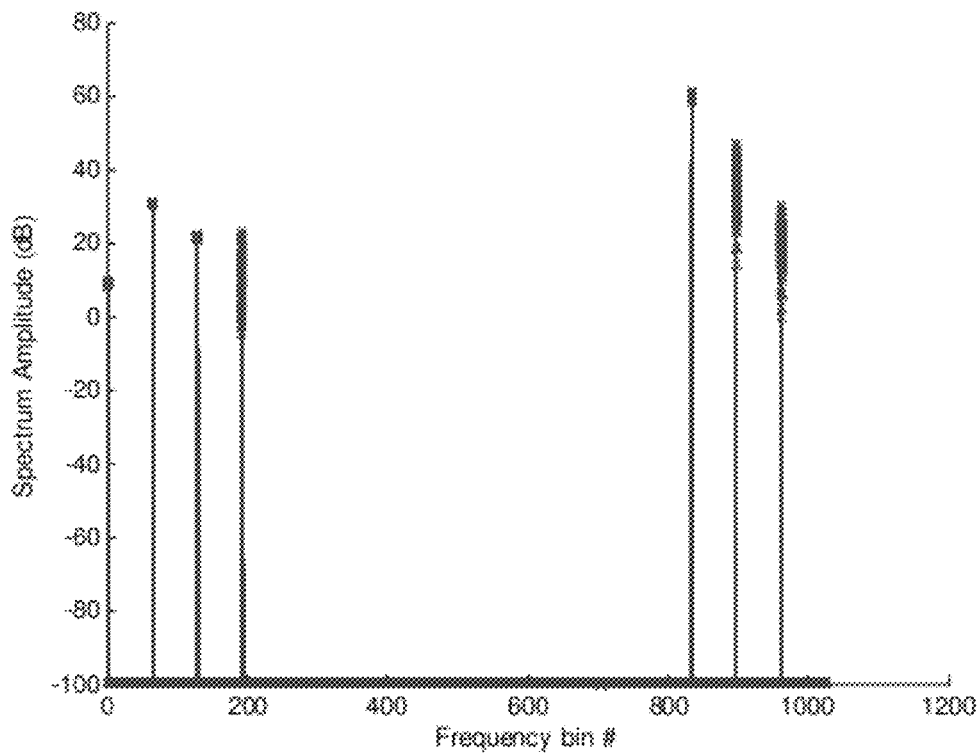

The resulting calculated frequency responses (using FIR coefficients as input) are plotted in FIG. 15A and FIG. 15B for ports 3 and 4 respectively in the digital filter shown in FIG. 14. The spectrum test signal is shown in FIG. 16A. After passing the time-domain test signal through the digital FIR version of the polyphase filters, the responses plotted in the frequency domain in FIG. 16B. Note that each tone produces a mirror image of itself, the magnitude of which is highly dependent on the component variations in any given Monte Carlo trial (each trial result is represented by a 'x' symbol in the figure).

Figure 17:
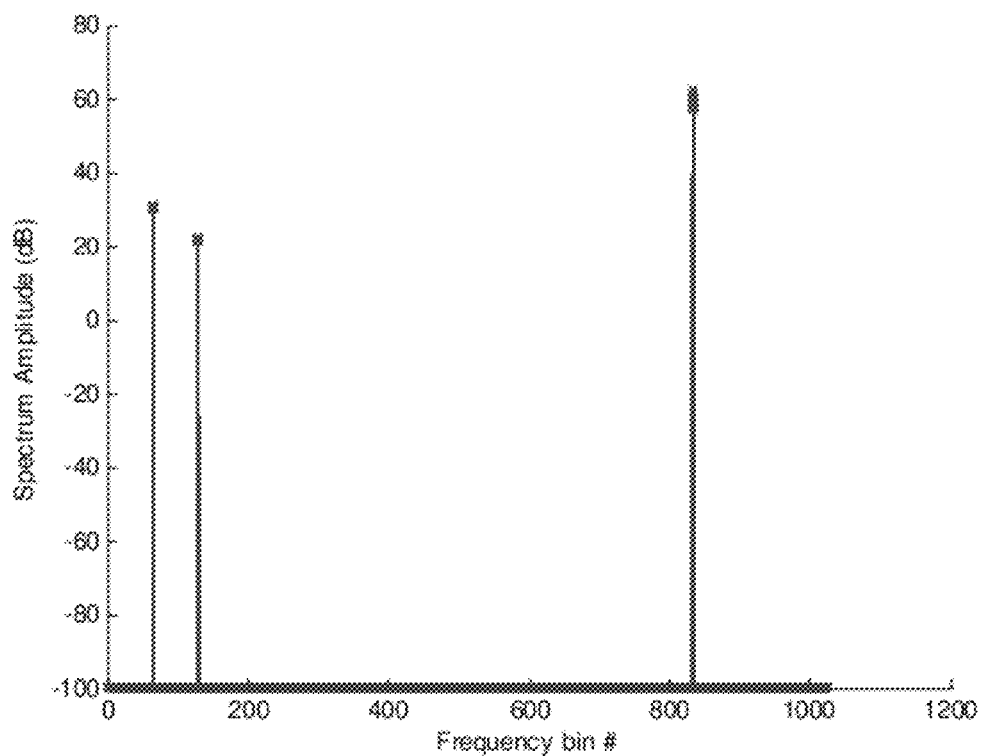
FIG. 17 illustrates a filtered test signal after correction within the digital domain according to various embodiments of the invention.

In order to evaluate the correction procedure, the frequency-domain correction coefficients are calculated in each case and correction is applied in the frequency domain to 1024-point segments of the test signal. The corrected frequency domain test signal is transformed back into the time domain to permit further processing. As a final check, the time-domain samples of the corrected signal are analyzed using an FFT to illustrate the effective cancellation of the image components of each input tone in FIG. 17.

One skilled in the art will recognize that the full potential of the original polyphase filter is realized after the correction algorithm is applied. Further filtering of the time-domain samples by complex digital FIR or IIR filters has been made possible.

The above discussion illustrates that a frequency independent and frequency-dependent quadrature skew can be represented by a single complex coefficient or an array of frequency domain coefficients. Also, the estimation of the complex quadrature skew coefficients can be achieved by the FFT operation when single-sideband test tones are sent. These can be sent one at a time or, for improved efficiency; multiple orthogonal tones can be generated using an IFFT to calculate half the coefficients of the entire spectrum in one test and the remaining half in a subsequent test.

Additionally, the equation that models the application of unwanted quadrature skew can be inverted, in both its frequency-independent and frequency-dependent forms. Frequency-dependent quadrature skew induced by analog component mismatch in a polyphase filter can be corrected in the frequency domain by using a FFT/IFFT transform pair and the corrected results made available for further processing.

As previously discussed, a calibration loop-back test is enabled at start-up or periodically (if temperature drifts need to be compensated). Care should be taken that the transmitter's own quadrature skew is calibrated out first, in order to use it as a reliable test generator for the receiver. This is more easily accommodated when the transmitter chain is of a direct-upconversion architecture or has a direct-upconversion mode available. As previously discussed, other simpler stimulus generation methods exist, such as the use of a synthesized PLL that is sequentially tuned to the discrete frequencies of interest allowing frequency domain coefficients to be evaluated one at a time.

For receivers and tuners, either factory calibration may be employed and a correction vector stored in memory, or a dedicated single-sideband tone generator may be integrated into the design.

One skilled in the art will recognize that this technique opens the door to more widespread exploitation of low-IF or NZIF receiver designs where digital post-correction can be incorporated in digital-domain signal processing.

The foregoing description of the invention has been described for purposes of clarity and understanding. It is not intended to limit the invention to the precise form disclosed. Various modifications may be possible within the scope and equivalence of the appended claims.

What is claimed is:

1. A frequency selective mismatch correcting multi-branch receiver comprising:
   an analog baseband signal portion coupled to receive a radio frequency (RF) signal, the analog baseband signal portion down-converts the RF signal and filters a plurality of analog multi-phase components of the down-converted RF signal;
   a plurality of analog-to-digital converters coupled to receive the plurality of analog multi-phase components and convert the plurality of multi-phase components into a plurality of digital multi-phase components;
   a Fourier transformer coupled to receive and transform the plurality of digital multi-phase components into a plurality of multi-phase component frequency coefficients;
   a filter coefficient computation unit coupled to receive the plurality of multi-phase component frequency coefficients, the filter coefficient computation unit derives a digital filter coefficient set for filtering a continuous stream of input samples from the plurality of analog-to-digital converters, the digital filter coefficient set being at least partially derived from ratios between mirror image pairs within the plurality of multiphase component frequency coefficients;
   a digital filter coupled to receive the continuous stream of input samples, the digital filter applies the digital filter coefficient set to the input samples;
   a test signal generator that generates at least one stimulus frequency tone; and
   a controller coupled to the test signal generator, the controller sequences through a plurality of stimulus frequencies using the test signal generator.

2. The receiver of claim 1 wherein the filter coefficient computation unit comprises a complex ratio calculation device that calculates a plurality of complex ratios between a plurality of complex measured test tones and a corresponding plurality of complex minor image tones to generate a vector of complex ratios.

3. The receiver of claim 2 wherein the filter coefficient computation unit transforms the vector of complex ratios into a set of discrete-time Finite Impulse Response filter coefficients to be used for run-time correction.

4. The receiver of claim 3 wherein the vector of complex ratios is used to perform frequency domain fast convolution using overlap-save or overlap-add methods for run-time correction.

5. The receiver of claim 2 wherein the calculation of the plurality of complex ratios is done sequentially.

6. The receiver of claim 2 wherein the calculation of the plurality of complex ratios is done in parallel.

7. The receiver of claim 2 wherein the filter coefficient computation unit transforms the vector of complex ratios into a set of complex filter coefficients for use in a runtime correction signal path.

8. The receiver of claim 1 further comprising a subtraction block coupled to the digital filter, the subtraction block subtracts a filtered complex conjugate sample from a received complex signal sample from the analog-to-digital converters, the subtraction block generates a digitally corrected sample.

9. The receiver of claim 1 wherein the controller causes the test signal generator, the Fourier transformer, and the filter coefficient computation unit to be operational during specific calibration periods of operation.

10. The receiver of claim 1 wherein the at least one stimulus frequency tone is generated sequentially using a single continuous wave generator with programmable frequency outputs covering a passband of the receiver.

11. The receiver of claim 1 wherein the at least one stimulus frequency tone is generated in parallel using an inverse discrete Fourier transform to create multiple orthogonal tones in one half of the passband and then in its minor image respectively.

12. The receiver of claim 1 wherein the at least one stimulus frequency tone is generated using a real, non-complex single branch up-conversion architecture.

13. The receiver of claim 12 wherein a local oscillator is programmed to have an offset in a transmit path relative to a receive path so that only one sideband is stimulated at any given time during calibration.

14. A method for correcting mismatch within a multi-branch receiver, the method comprising:
   converting an test signal having calibration stimuli into an analog baseband signal;
   filtering a plurality of multi-phase components within the analog baseband signal;
   converting each of the multi-phase components into respective digital signals;
   transforming each of the respective digital signals into a plurality of frequency coefficient values;
   calculating a set of complex ratio values resulting from a ratio of each complex measured test tone and its corresponding complex minor image tone within the frequency coefficient values; and
   identifying a set of complex filter coefficients from the set of complex ratio values, the set of complex filter coefficients to be applied to runtime signal coefficients to correct mismatch.

15. The method of claim 14 wherein the test signal is generated and processed during a specific calibration period of the multi-branch receiver.

16. The method of claim 14 wherein the set of complex ratio values is transformed into a set of discrete-time Finite Impulse Response filter coefficients to be used for runtime correction.

17. The method of claim 14 wherein the set of complex ratio values is used to perform frequency domain fast convolution using overlap-save or overlap-add methods for runtime correction.

18. The method of claim 14 wherein the calibration stimuli are generated sequentially using a single continuous wave generator with programmable frequency outputs covering a passband of the receiver.

19. The method of claim 14 wherein the calibration stimuli are generated in parallel using an inverse discrete Fourier transform to create a first set of orthogonal tones in a first half of a passband of the receiver and a second set of orthogonal tones in a second half of the passband.

20. A frequency selective mismatch correcting multi-branch receiver comprising:
   an analog baseband signal portion coupled to receive a radio frequency (RF) signal, the analog baseband signal portion down converts the RF signal and filters a plurality of multi-phase components in the down converted RF signal;
   a plurality of analog to digital converters coupled to receive the multi-phase components and to convert the multiphase components into corresponding plurality of digital multi-phase components;

a discrete Fourier transform coupled to receive a first multi-phase digital component within the plurality of multi-phase digital components and generate a plurality of multi-phase component frequency coefficients;

a complex ratio calculation unit that receives the plurality of frequency coefficients and calculates a first complex ratio between a first complex measured test tone and a first corresponding complex minor image tone, the first complex ratio being included in vector of complex ratios associated mismatch errors within the plurality of multi-phase component frequency coefficients;

a filter coefficient computation unit coupled to receive the vector of complex ratios and generate a set of complex filter coefficients for use in a runtime correction signal path;

a complex conjugate computation unit coupled to receive runtime samples from the analog-to-digital converters and generate a plurality of corresponding complex conjugate samples;

a filter coupled to receive the corresponding complex conjugate samples, the filter applies the set of complex filter coefficients to the complex conjugate samples; and a subtraction block that subtracts the filtered complex conjugate samples from the runtime samples to correct mismatch error.

\* \* \* \* \*